(12) United States Patent
Furui et al.

(10) Patent No.: US 8,466,534 B2
(45) Date of Patent: Jun. 18, 2013

(54) RADIATION DETECTOR, AND A RADIOGRAPHIC APPARATUS HAVING THE SAME

(75) Inventors: Shingo Furui, Higashiosaka (JP);
Toshinori Yoshimuta, Takatsuki (JP);
Junichi Suzuki, Kyoto (JP); Koji Watadani, Kyoto (JP); Satoru Morita, Takatsuki (JP)

(73) Assignee: Shimadzu Corporation, Kyoto (JP)

( * ) Notice: Subject to any disclaimer, the term of this patent is extended or adjusted under 35 U.S.C. 154(b) by 7 days.

(21) Appl. No.: 13/203,769

(22) PCT Filed: Mar. 26, 2010

(86) PCT No.: PCT/JP2010/002195
§ 371 (c)(1),
(2), (4) Date: Aug. 29, 2011

(87) PCT Pub. No.: WO2010/113451
PCT Pub. Date: Oct. 7, 2010

(65) Prior Publication Data
US 2011/0315978 A1 Dec. 29, 2011

(30) Foreign Application Priority Data
Apr. 3, 2009 (JP) ................................ 2009-091023

(51) Int. Cl.
*H01L 271/46* (2006.01)
(52) U.S. Cl.
USPC ............. 257/448; 257/42; 257/431; 257/433; 257/E31.008; 257/E33.076; 257/E31.087

(58) Field of Classification Search
USPC .................... 257/42, 431, 433, 448, E31.008, 257/E31.087, E33.076
See application file for complete search history.

(56) References Cited

U.S. PATENT DOCUMENTS

2002/0148949 A1* 10/2002 Sato et al. ................. 250/214.1
2008/0073567 A1 3/2008 Kido et al.
2010/0123101 A1 5/2010 Ono

FOREIGN PATENT DOCUMENTS

| CN | 101147682 A | 3/2008 |
| JP | 2002-311144 A | 10/2002 |
| WO | WO-2008/136272 A1 | 11/2008 |

OTHER PUBLICATIONS

The First Office Action for the Application No. 2010800146302 from The State Intellectual Property Office of the People's Republic of China dated Jan. 31, 2013.

* cited by examiner

*Primary Examiner* — Minchul Yang
(74) *Attorney, Agent, or Firm* — Cheng Law Group, PLLC

(57) ABSTRACT

The construction of this invention includes an active matrix substrate, an amorphous selenium layer, a high resistance layer, a gold electrode layer, an insulating layer and an auxiliary plate laminated in this order. In one aspect of the present invention, the insulating layer has an inorganic anion exchanger added thereto in order to provide a radiation detector which prevents void formation and pinhole formation in the amorphous semiconductor layer and carrier selective high resistance film, without accumulating electric charges on the auxiliary plate. The inorganic anion exchanger adsorbs chloride ions in the insulating layer, thereby preventing destruction of X-ray detector due to the chloride ions drawn to the gold electrode layer.

15 Claims, 4 Drawing Sheets

RADIATION DETECTOR, AND A RADIOGRAPHIC APPARATUS HAVING THE SAME

TECHNICAL FIELD

This invention relates to a radiation detector for industrial or medical use and a radiographic apparatus having the same, and more particularly to a radiation detector which converts radiation directly into carriers, and a radiographic apparatus having the same.

BACKGROUND ART

Conventionally, a direct conversion type radiation detector which converts radiation directly into carriers (charge information) in a semiconductor layer applies a predetermined bias voltage to a common electrode layer formed on a front surface of the semiconductor layer which is sensitive to radiation, and collects the carriers thereby generated in the semiconductor layer in picture electrodes formed on a back surface of the semiconductor layer. Further, the carriers collected are read as radiation detection signals, using an active matrix substrate, thereby to detect the radiation.

An amorphous semiconductor layer such as a-Se (amorphous selenium), for example, is used as the radiation sensitive semiconductor layer.

Since the direct conversion type radiation detector applies a high voltage to the common electrode layer, a discharge occurs along the surface of the amorphous semiconductor layer. In order to solve the problem of this creeping discharge, in Patent Document 1 and in FIG. 5, entire surfaces of an amorphous semiconductor layer 51, a common electrode layer 52 and a carrier selective high resistance film 53 are covered with an insulating layer 55 of high withstand voltage (epoxy resin). An active matrix substrate 54 covers a lower surface of the amorphous semiconductor layer 51.

Further, Patent Document 1 also indicates a problem that solvent components of the epoxy resin react with a-Se forming the amorphous semiconductor layer 51, to discolor the surface of the amorphous semiconductor layer 51, and lower the withstand voltage. So, the entire surface of the amorphous semiconductor layer 51 is covered with the solvent-resistant and carrier selective high resistance film 53 such as $Sb_2S_3$ film, to reduce the reaction between the solvent components of the epoxy resin and a-Se and to prevent alteration of the surface of the amorphous semiconductor layer 51 and lowering of the withstand voltage.

[Patent Document 1]
Unexamined Patent Publication No. 2002-311144

DISCLOSURE OF THE INVENTION

[Problem to be Solved by the Invention]

However, a new problem not disclosed in the above Patent Document 1 has been found. That is, as the radiation detector 50 continues to be used, as seen in the right portion of FIG. 5, negative charges accumulate on a surface, i.e. a radiation incidence surface, opposite to facing surfaces of an auxiliary plate 56 (glass) and an insulating layer 55. Since the common electrode layer 52 is in a state of high potential, such negative charges accumulate by being drawn thereto. That is, the negative charges will accumulate as if the auxiliary plate 56, insulating layer 55 and common electrode layer 52 constituted a capacitor.

The static electricity due to these accumulated charges affects radiation detection signals read from the active matrix substrate 54, to produce noise in the radiation detection signals. In order to prevent this noise, a construction is adopted to ground the radiation incidence surface of the auxiliary plate 56 to prevent accumulation of electric charges. This removes the noise superimposed on the radiation detection signals.

However, the above construction gives rise to a problem of increasing defective pixels. In order to find out its cause, Inventors have observed the high resistance film 53 covering the entire surface of the amorphous semiconductor layer 51 with an electron microscope. It has been confirmed that pinholes as shown in FIG. 6 have been formed. It has also newly been confirmed that through these pinholes voids are formed in the surface of the amorphous semiconductor layer 51.

Inventors herein have made intensive research and attained the following findings. First, in order to determine what substances form the voids and pinholes in the amorphous semiconductor layer 51 and carrier selective high resistance film 53, an element specifying inspection was conducted with an X-ray fluorescence spectrometer for void portions and pinhole portions as well as other portions of the amorphous semiconductor layer 51 and carrier selective high resistance film 53. FIG. 7 shows elements detected from the void portions and pinhole portions. FIG. 8 shows elements detected in portions without the voids and pinholes. As a result, chlorine atoms (Cl) which should not be found have been detected from the void portions and pinhole portions. Further, an investigation was made as to why the chlorine atoms exist, and it has newly been found that they remained as a byproduct having failed to be removed when preparing an epoxy prepolymer which is the base resin of the epoxy resin.

The base resin of the epoxy resin is an epoxy prepolymer which is a mixture of bisphenol A ($C_{15}H_{16}O_2$) and epichlorohydrin ($C_3H_5ClO$). This epoxy prepolymer has chloride ions ($Cl^-$) of epichlorohydrin remaining therein as a byproduct without being removed. Then, the residual concentration of chloride ions in the epoxy prepolymer used in this application was measured, and it was about 400 ppm to 1000 ppm.

It has been found that, for the above reason, chloride ions remain also in the epoxy resin formed by mixing the epoxy prepolymer and curing agent, and that pinholes are formed by this chlorine corroding the $Sb_2S_3$ film which is the carrier selective high resistance film 53. Penetrated by the pinholes, the $Sb_2S_3$ film has a reduced function as the carrier selecting film. This increases dark current and increases defective pixels. The chloride ions pass through these pinholes to corrode the surface of the amorphous semiconductor layer 51 and form voids.

Grounding the auxiliary plate 56 is also considered one of the causes of the chloride ions forming the pinholes in the $Sb_2S_3$ film which is the carrier selective high resistance film 53. Comparing the case of grounding the auxiliary plate 56 and the case of not grounding the auxiliary plate 56, field intensity from the common electrode layer 52 toward the auxiliary plate 56 is stronger in the case of grounding the auxiliary plate 56 than not grounding when a positive bias voltage is applied to the common electrode layer 52. This is considered to cause the chloride ions in the epoxy resin to be drawn strongly to this electric field to concentrate near the common electrode layer 52, whereby this chlorine corrodes the $Sb_2S_3$ film and amorphous semiconductor layer 51.

This invention has been made having regard to the state of the art noted above, and its object is to provide a radiation detector which prevents void formation and pinhole formation in an amorphous semiconductor layer and a carrier selective high resistance film, without accumulating electric charges on an auxiliary plate.

[Means for Solving the Problem]

To fulfill the above object, this invention provides the following construction.

A radiation detector defined in the first aspect of the present invention comprises a conversion layer for converting light or radiation into carriers; a common electrode layer to which a positive bias voltage is applied; an insulating layer; and a grounded conductive layer; which are laminated in this order on an active matrix substrate having a plurality of switching elements for reading the carriers; wherein the insulating layer includes an anion exchanger.

[Function and effect] According to the construction of this invention, the active matrix substrate, conversion layer, common electrode layer, insulating layer and conductive layer are laminated in this order. If anions remained in the insulating layer, the anions would be drawn to the common electrode layer with the positive bias voltage having been applied thereto, to destroy the construction of the radiation detector. In order to prevent this, in this invention, the anion exchanger is added to the insulating layer. Since the anion exchanger adsorbs the anions, destruction of the radiation detector due to the anions drawn to the common electrode layer can be prevented.

The invention according to the second aspect of the present invention provides a resistance film between the conversion layer and the common electrode layer for selectively transmitting the carriers.

[Function and effect] With the above construction, even if a high positive charge is applied to the common electrode layer, the carriers are prevented from entering the conversion layer from the common electrode layer.

The invention according to the third aspect of the present invention provides the radiation detector according to the first aspect of the present invention, wherein the insulating layer is formed of an epoxy resin.

[Function and effect] The construction of this invention can provide the radiation detector capable of detecting radiation with increased reliability. Since the epoxy resin generates little heat at the time of hardening, the chance of the conversion layer undergoing thermal change can be inhibited as much as possible. Although the anions may remain in the epoxy resin, they will be adsorbed by the anion exchanger, and thus destruction of the radiation detector will be prevented.

The invention in the fourth aspect of the present invention provides the radiation detector according to the first, second, and third aspects of the present invention, wherein the conversion layer comprises amorphous selenium; and the common electrode layer is a gold electrode layer whose thickness in a direction of lamination is at most 200 nm.

[Function and effect] It is known that the radiation detector is destroyed by the anions reaching the high resistance layer. So, it seems possible to prevent this by thickening the common electrode layer. According to the above construction, the thickness of the common electrode layer is 200 nm or less (preferably 100 nm). In laminating the common electrode layer, the common electrode layer cannot be made very thick since it is necessary to inhibit thermal change of the conversion layer. According to the above construction, the thickness of the common electrode layer is sufficiently thin. Moreover, according to the above construction, the anions are in the state of being adsorbed within the insulating layer, and so, even if the common electrode layer is thin, the radiation detector is never destroyed.

According to the above construction, the common electrode layer is formed of gold. Consequently, the radiation detector provided can reliably apply the positive bias voltage while making the film thickness thin. It is known that anions penetrate the gold electrode layer. However, since the anions are in the state of being adsorbed within the insulating layer according to the above construction, the radiation detector is never destroyed though the common electrode layer is formed of gold.

The invention in the fifth aspect of the present invention provides the radiation detector according to the first, second, third, and fourth aspects of the present invention, wherein the anion exchanger is an inorganic anion exchanger.

[Function and effect] The above construction represents a specific example of the anion exchanger. It is known that the anions which destroy the radiation detector are inorganic anions. Thus, the above construction can inhibit destruction of the radiation detector with increased reliability.

The invention in the sixth aspect of the present invention provides the radiation detector according to the fifth aspect of the present invention, wherein the anion exchanger adsorbs chloride ions.

[Function and effect] According to the above construction, destruction of the radiation detector can be inhibited with increased reliability. When the epoxy resin is used for the insulating layer, for example, hydrochloric acid will be released from the hardening epoxy resin. The chloride ions resulting from this are the main anions that cause destruction of the radiation detector. Since the inorganic anion exchanger adsorbs the chloride ions according to the above construction, destruction of the radiation detector is inhibited reliably.

The invention in the seventh aspect of the present invention provides the radiation detector according to the fifth aspect of the present invention, wherein the anion exchanger is at least one substance selected from a group consisting of a hydrotalcite compound, zirconium hydroxide, titanium, hydroxide, yttrium compound, bismuth hydroxide, bismuth nitrate and bismuth oxide compound.

[Function and effect] The above construction represents a specific example of the anion exchanger. The inorganic anions may be selected to be at least one substance or more selected from the group consisting of the compounds noted above.

The invention in the eighth aspect of the present invention provides the radiation detector according to the fifth aspect of the present invention, wherein the anion exchanger is exclusive of chlorine atoms.

[Function and effect] According to the above construction, chlorine atoms are not included in the anion exchanger. Consequently, movable chlorine atoms in the insulating layer can be decreased reliably. Therefore, the chloride ions are never drawn to the common electrode layer.

The invention in the ninth aspect of the present invention provides the radiation detector according to the first aspect of the present invention, comprising side insulating layers formed of the same material as the insulating layer, and covering side surfaces of the conversion layer, the common electrode layer and the insulating layer laminated.

[Function and effect] According to the above construction, the side surfaces of the conversion layer, common electrode layer and insulating layer are covered by the side insulating layers. Since the side insulating layers include the inorganic anion exchanger, the chloride ions are never drawn to the side surfaces of the conversion layer, common electrode layer or insulating layer.

The invention in the tenth aspect of the present invention provides a radiographic apparatus having the radiation detector according to the first aspect of the present invention, the apparatus comprising a radiation source for emitting radiation.

[Function and effect] According to the above construction, a radiographic apparatus is provided which includes the radiation detector having little possibility of breakdown.

Figure 1:
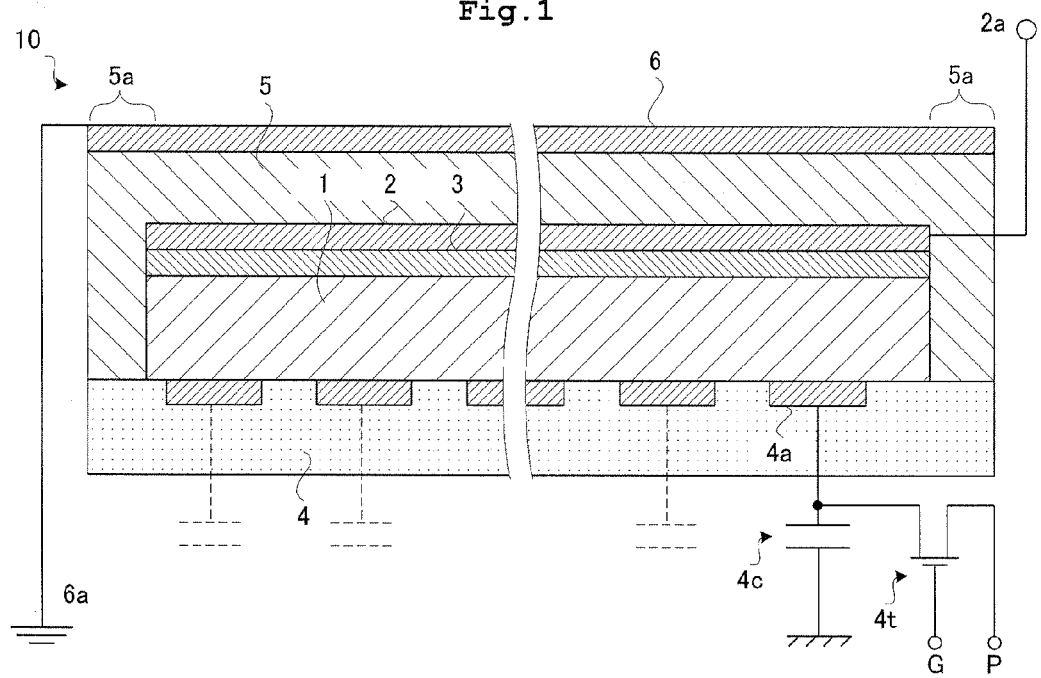
FIG. 1 is a sectional view illustrating a construction of an X-ray detector according to Embodiment 1.

DESCRIPTION OF REFERENCES 1 amorphous selenium layer (conversion layer)
2 gold electrode layer (common electrode layer)
3 high resistance layer
4 active matrix substrate
5 insulating layer
6 conductive layer (auxiliary plate)
10 X-ray detector (radiation detector)
31 X-ray apparatus (radiographic apparatus)
33 X-ray tube (radiation source)

BEST MODE FOR CARRYING OUT THE INVENTION

A construction of a radiation detector according to each embodiment, which is the best mode of this invention, will be described next. X-rays in the following description are an example of the radiation in this invention.
[Embodiment 1]
An X-ray detector 10 according to Embodiment 1 includes an active matrix substrate 4 for storing and reading carriers, an amorphous selenium layer 1 for converting light or X-rays into carrier pairs, a high resistance layer 3, a gold electrode layer 2, an insulating layer 5 formed of an epoxy resin, and an auxiliary plate 6 formed of glass. The X-ray detector 10 has a construction with the active matrix substrate 4, amorphous selenium layer 1, high resistance layer 3, gold electrode layer 2, insulating layer 5 and auxiliary plate 6 laminated in order. The X-ray detector corresponds to the radiation detector in this invention. The amorphous selenium layer corresponds to the conversion layer in this invention. The gold electrode layer corresponds to the common electrode layer in this invention.

The amorphous selenium layer 1 is formed of high purity amorphous selenium with a specific resistance of $10^9$ Ωcm or more (preferably $10^{11}$ Ωcm or more). Its thickness in the direction of lamination is 0.5 mm to 1.5 mm. Light or X-rays incident on this amorphous selenium layer 1 generate(s) carrier pairs which are pairs of hole and electron. The amorphous selenium layer 1 is placed in a strong electric field, which moves the carriers toward the active matrix substrate 4.

The active matrix substrate 4 has, embedded therein, collection electrodes 4a for carrier collection. The collection electrodes 4a are in contact with the amorphous selenium layer 1, and are arranged in two dimensions on the surface of the active matrix substrate 4. These collection electrodes 4a are connected to capacitors 4c for carrier storage as shown in FIG. 1. The capacitors 4c store electric charges collected by the collection electrodes 4a. The capacitors 4c are connected to transistors 4t. These transistors 4t includes, besides input terminals connected to the capacitors 4c, gates G for current control, and readout electrodes P for detection signal readout. When the gates G of the transistors 4t are turned on, the electric charges (above-mentioned carriers) stored in the capacitors 4c will flow toward the readout electrodes P.

Figure 2:
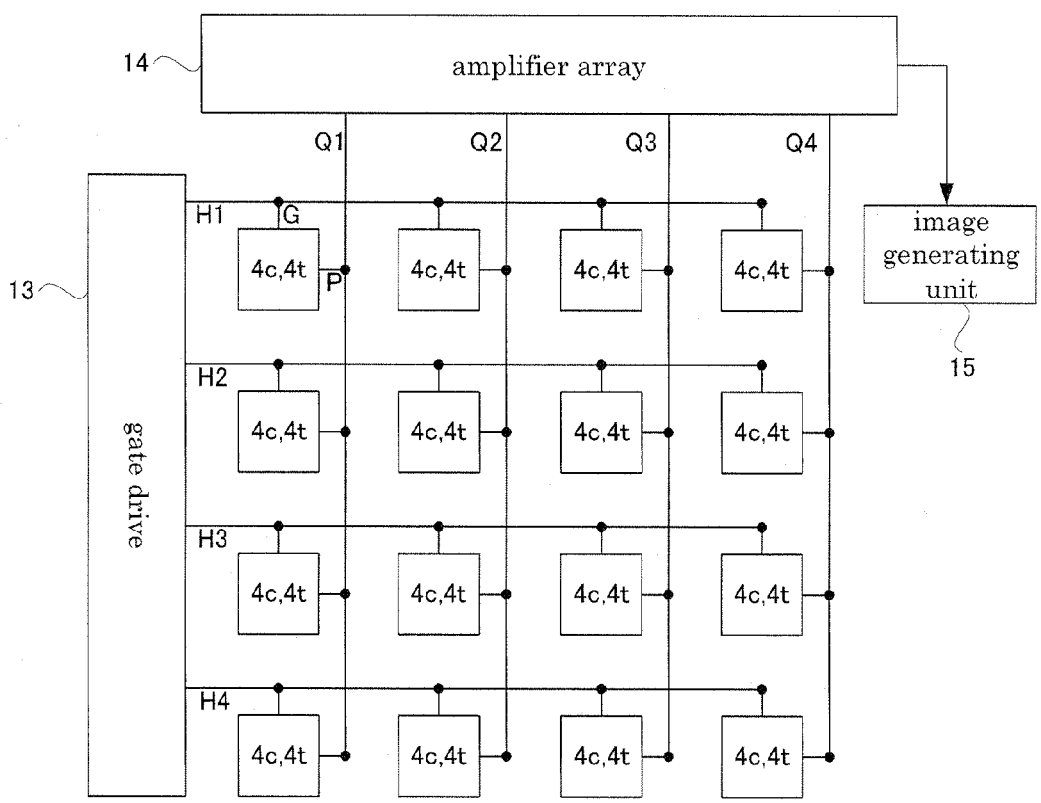
FIG. 2 is a plan view illustrating the construction of the X-ray detector according to Embodiment 1.

In FIG. 1, only one capacitor 4c is shown for simplicity's sake. However, the actual active matrix substrate 4 has the capacitors 4c, transistors 4t, gates G and readout electrodes P provided for the respective collection electrodes 4a. Therefore, the capacitors 4c and transistors 4t are arranged in two dimensions as shown in FIG. 2. The readout electrodes P of the transistors 4t arranged vertically in FIG. 2 are all connected to common amplifier electrodes Q1-Q4. The gates G of the transistors 4t arranged horizontally in FIG. 2 are all connected to common gate control electrodes H1-H4. The gate control electrodes H1-H4 are connected to a gate drive 13, while the amplifier electrodes Q1-Q4 are connected to an amplifier array 14.

A construction for reading electric charges from each capacitor 4c will be described. It is assumed that electric charges are stored in each of the capacitors 4c in FIG. 2. The gate drive 13 turns on the transistors 4t through the gate control electrode H1 all at once. The four transistors 4t arranged horizontally and turned on transmit the electric charges to the amplifier array 14 through the amplifier electrodes Q1-Q4.

Next, the gate drive 13 turns on the transistors 4t through the gate control electrode H2 all at once. In this way, the gate drive 13 turns on the gate control electrodes H1-H4 in order. The transistors 4t in the different rows are turned on accordingly. Thus, the X-ray detector 10 has a construction for reading the electric charges stored in the respective capacitors 4c on a row-by-row basis.

The amplifier array 14 has amplifiers provided for the respective amplifier electrodes Q1-Q4 for amplifying the signals. The original signals inputted from the amplifier electrodes Q1-Q4 to the amplifier array 14 are thereby amplified. The amplified signals outputted from the amplifier array 14 are outputted to an image generating unit 15. The respective amplified signals are converted into pixel values, which are arranged in two dimensions to form an image.

The collection electrodes 4a, capacitors 4c and transistors 4t constitute X-ray detecting elements for detecting X-rays. The X-ray detecting elements form a two-dimensional matrix of 1,024×1,024 arranged vertically and horizontally in the active matrix substrate 4.

The gold electrode layer 2 is connected to a node 2a as shown in FIG. 1. A high potential is supplied to the node 2a, whereby a positive bias voltage of 10 kV in potential, for example, is applied to the gold electrode layer 2. This gold electrode layer 2 has a thickness (film thickness) of 200 nm or less in the direction of lamination. If the gold electrode layer 2 were formed thick, the amorphous selenium layer 1 could become modified by heat. In order to prevent this, the thickness of the gold electrode layer 2 is made 200 nm or less which is sufficiently thin.

The high resistance layer 3 is a layer for blocking injection of holes from the gold electrode layer 2 into the amorphous selenium layer 1. This high resistance layer 3 has n-type $Sb_2S_3$ as a main component, its thickness is about 0.1 μm to 5

μm, and its specific resistance is $10^9$ Ωcm or more. Where the specific resistance is as high as $10^9$ Ωcm or more, it may be better, depending on the case, to use a p-type material instead of n-type $Sb_2S_3$. The p-type material selected at this time May be $Sb_2Te_3$, ZnTe or the like. $Sb_2S_3$ with an addition of impurities can also be used as the p-type material.

The insulating layer 5 is formed of an epoxy resin. The high potential of the gold electrode layer 2 is confined by the insulating layer 5 covering the gold electrode layer 2. This insulating layer 5 covers also lateral ends of the amorphous selenium layer 1 in peripheral regions of the X-ray detector 10. Therefore, in the peripheral regions of the X-ray detector 10, the insulating layer 5 is in contact with the active matrix substrate 4. That is, the amorphous selenium layer 1, high resistance layer 3 and gold electrode layer 2 are sealed by the active matrix substrate 4 and insulating layer 5. In other words, lateral ends of the amorphous selenium layer 1, high resistance layer 3 and gold electrode layer 2 are covered by the insulating layer. In this way, the electric charges applied to the gold electrode layer 2 are prevented from discharging and escaping outside. The thickness of this insulating layer 5 is set so that the distance from the active matrix substrate 4 to the auxiliary plate 6 may be 1 mm to 5 mm (preferably 2 mm to 4 mm).

Side surfaces of the amorphous selenium layer 1, gold electrode layer 2 and insulating layer 5 are covered by side insulating layers 5a. The side insulating layers are formed of the same material as the insulating layer 5.

The auxiliary plate 6 is a plate made of quartz glass, and faces the insulating layer 5. Its thickness is 0.5 mm to 1.5 mm. The plane of X-ray incidence of the auxiliary plate 6 opposite to its surface contacting the insulating layer 5 is coated with conductive carbon particles, and therefore the front surface of the auxiliary plate 6 is rendered conductive. This front surface of the auxiliary plate 6 is grounded by being connected to a grounding electrode 6a. Therefore, the plane of X-ray incidence of the auxiliary plate 6 has conductivity. The auxiliary plate corresponds to the conductive layer in this invention.

Figure 3:
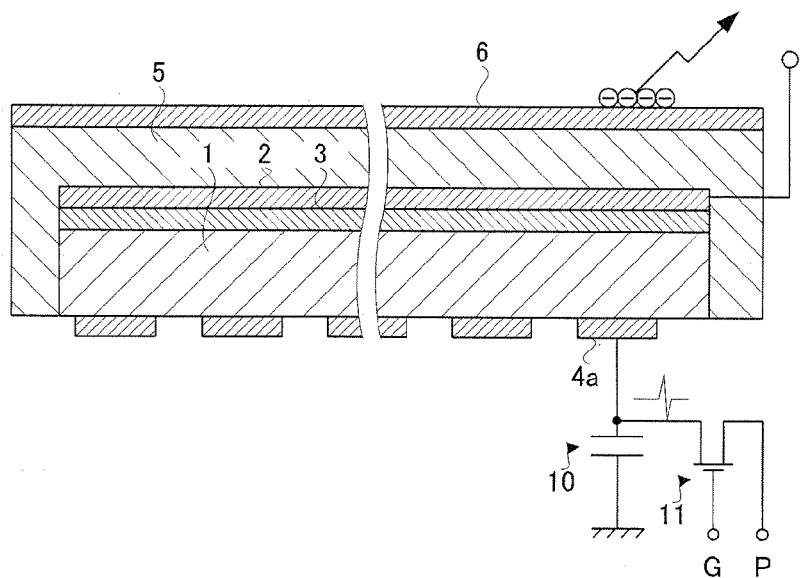
FIG. 3 is a sectional view illustrating the construction of the X-ray detector according to Embodiment 1.

When the high positive bias voltage of the gold electrode layer 2 is applied, the surface (plane of X-ray incidence) of the auxiliary plate 6, in response thereto, tends to be negatively charged. These negative charges are promptly released to the grounding electrode 6a connected to the auxiliary plate 6. If the negative charges were allowed to accumulate on the surface of the auxiliary plate 6 as shown in FIG. 3, an electric discharge would take place when the negative charges were accumulated to some extent. Then, the potential of the gold electrode layer 2 would change slightly. This would change the state of the electric field where the amorphous selenium layer 1 is placed. The active matrix substrate 4 would detect this change of the electric field. That is, unless the negative charges are promptly released from the auxiliary plate 6, noise will be superimposed on X-ray detection data.

The most characteristic construction in Embodiment 1 will be described. That is, an inorganic anion exchanger is added to the insulating layer 5. The inorganic anion exchanger comprises at least one substance or more selected from a group consisting of a hydrotalcite compound, zirconium hydroxide, titanium hydroxide, yttrium compound, bismuth hydroxide, bismuth nitrate and bismuth oxide compound. These can all adsorb inorganic anions, especially chloride ions. At this time, the inorganic anion exchanger releases hydroxide ions and the like in exchange for adsorbing chloride ions. The inorganic anion exchanger is contained in the insulating layer 5 at about 2% by weight, for example. Preferably, the inorganic anion exchanger selected does not contain chlorine elements.

At the time of manufacturing the X-ray detector 10, heat generated in the step of hardening the insulating layer 5 and side insulating layers 5a is conducted to the amorphous selenium layer 1. When the amorphous selenium layer 1 is exposed to high heat, the selenium of the amorphous selenium layer 1 will crystallize and become unable to convert X-rays into carriers. So, it is better to avoid heating of the amorphous selenium layer 1 as much as possible. The hardening reaction of the epoxy resin is an exoergic reaction, but the quantity of heat generated is not very large. Therefore, the epoxy resin is desirable as a material for forming the insulating layer 5.

Incidentally, the epoxy resin is a product of polymerization of bisphenol A and epichlorohydrin. At this time, hydrochloric acid is formed by the polymerization reaction. It is difficult to remove this hydrochloric acid from the epoxy resin completely. Specifically, chlorine in a concentration of 400 ppm to 1,000 ppm remains in a certain form in the epoxy resin. Thus, the epoxy resin has a certain amount of chlorine element remaining therein. This chlorine element becomes a source of chloride ions included in the epoxy resin.

When chloride ions remain in the insulating layer 5, these are drawn toward the gold electrode layer 2. This causes an unexpected inconvenience. That is, the chloride ions will invade the gold electrode layer 2, and will reach the high resistance layer 3 and amorphous selenium layer 1. When the high resistance layer 3 is destroyed by the chloride ions, a phenomenon will arise in which holes are transmitted to the amorphous selenium layer 1. When the chloride ions reach the amorphous selenium layer 1, the amorphous selenium layer 1 will be destroyed. When such a situation occurs, it becomes impossible to detect X-rays. That is, the X-ray detecting elements including the collection electrodes 4a, capacitors 4c and transistors 4t will break down. Then, defective pixels will appear on images outputted from the image generating unit 15.

According to the construction of Embodiment 1, the inorganic anion exchanger is added to the insulating layer 5 in order to inhibit such an inconvenience. In this way, the chloride ions remaining in a free state in the insulating layer 5 are entirely adsorbed by the inorganic anion exchanger, and cannot move as drawn toward the gold electrode layer 2. Therefore, destruction by the chloride ions of the high resistance layer 3 and amorphous selenium layer 1 can be prevented.

If the auxiliary plate 6 is not grounded, the breakdown of the X-ray detecting elements is checked to some extent. As a reason therefor, it is guessed that, with the insulating layer 5 held between the gold electrode layer 2 at a high potential and the grounded auxiliary plate 6, the chloride ions in the insulating layer 5 are drawn more intensely to the gold electrode layer 2. In spite of such a standpoint, a construction which does not ground the auxiliary plate 6 is impossible from the point of view of noise reduction, and from the point of view of preventing modification (crystallization) of amorphous selenium, and a material free of chlorine elements other than the epoxy resin cannot be used for the insulating layer 5, either. In the construction of Embodiment 1, the two incompatible requirements can be satisfied at once by using the inorganic anion exchanger.

According to the construction of Embodiment 1, as described above, the active matrix substrate 4, amorphous selenium layer 1, high resistance layer 3, gold electrode layer 2, insulating layer 5 and auxiliary plate 6 are laminated in this order. If chloride ions remained in the insulating layer 5, the chloride ions would be drawn to the gold electrode layer 2 with the positive bias voltage having been applied thereto, to destroy the construction of the X-ray detector 10. In order to prevent this, in Embodiment 1, the inorganic anion exchanger is added to the insulating layer 5. Since the inorganic anion exchanger adsorbs the chloride ions, destruction of the X-ray detector 10 due to the chloride ions drawn to the gold electrode layer 2 can be prevented.

The construction of Embodiment 1 can provide the X-ray detector 10 capable of detecting radiation with increased reliability. Since the epoxy resin generates little heat at the time of hardening, the chance of the amorphous selenium layer 1 undergoing thermal change can be reduced as much as possible. Although the chloride ions may remain in the epoxy resin, they will be adsorbed by the inorganic anion exchanger, and thus destruction of the X-ray detector 10 will be prevented.

It is known that the X-ray detector 10 is destroyed by the chloride ions reaching the high resistance layer 3. So, it seems possible to prevent this by thickening the gold electrode layer 2. According to the construction of Embodiment 1, the thickness of the gold electrode layer 2 is 100 nm. In laminating the gold electrode layer 2, the gold electrode layer 2 cannot be made very thick since it is necessary to inhibit thermal change of the amorphous selenium layer 1. According to the construction of Embodiment 1, the thickness of the gold electrode layer 2 is sufficiently thin. Moreover, according to the construction of Embodiment 1, the chloride ions are in the state of being adsorbed within the insulating layer 5, and so, even if the gold electrode layer 2 is thin, the X-ray detector 10 is never destroyed. It is to be noted that the gold electrode layer 2 can also be thickened to 200 nm.

According to the construction of Embodiment 1, the gold electrode layer 2 is formed of gold. Consequently, the X-ray detector 10 provided can reliably apply the positive bias voltage while making the film thickness thin. It is known that chloride ions penetrate the gold electrode layer 2. However, since the chloride ions are in the state of being adsorbed within the insulating layer 5 according to the construction of Embodiment 1, the X-ray detector 10 is never destroyed though the gold electrode layer 2 is formed of gold.

According to the construction of Embodiment 1, destruction of the X-ray detector 10 can be inhibited with increased reliability. When the epoxy resin is used for the insulating layer 5, hydrochloric acid will be released from the hardening epoxy resin. The chloride ions resulting from this are the main chloride ions that cause destruction of the X-ray detector 10. Since the inorganic anion exchanger adsorbs the chloride ions according to the construction of Embodiment 1, destruction of the X-ray detector 10 is inhibited reliably.

According to the construction of Embodiment 1, chlorine elements are not included in the inorganic anion exchanger. Consequently, movable chlorine elements in the insulating layer 5 can be decreased reliably. Therefore, the chloride ions are never drawn to the gold electrode layer 2.

According to the construction of Embodiment 1, the side surfaces of the amorphous selenium layer 1, gold electrode layer 2 and insulating layer 5 are covered by the side insulating layers 5a. Since the side insulating layers 5a are formed of the same material as the insulating layer 5 and include the inorganic anion exchanger, the chloride ions are never drawn to the side surfaces of the amorphous selenium layer 1, gold electrode layer 2 or insulating layer 5.

[Embodiment 2]

Next, a radiographic apparatus according to Embodiment 2 will be described. This radiographic apparatus has, mounted therein, the X-ray detector 10 according to Embodiment 1.

Figure 4:
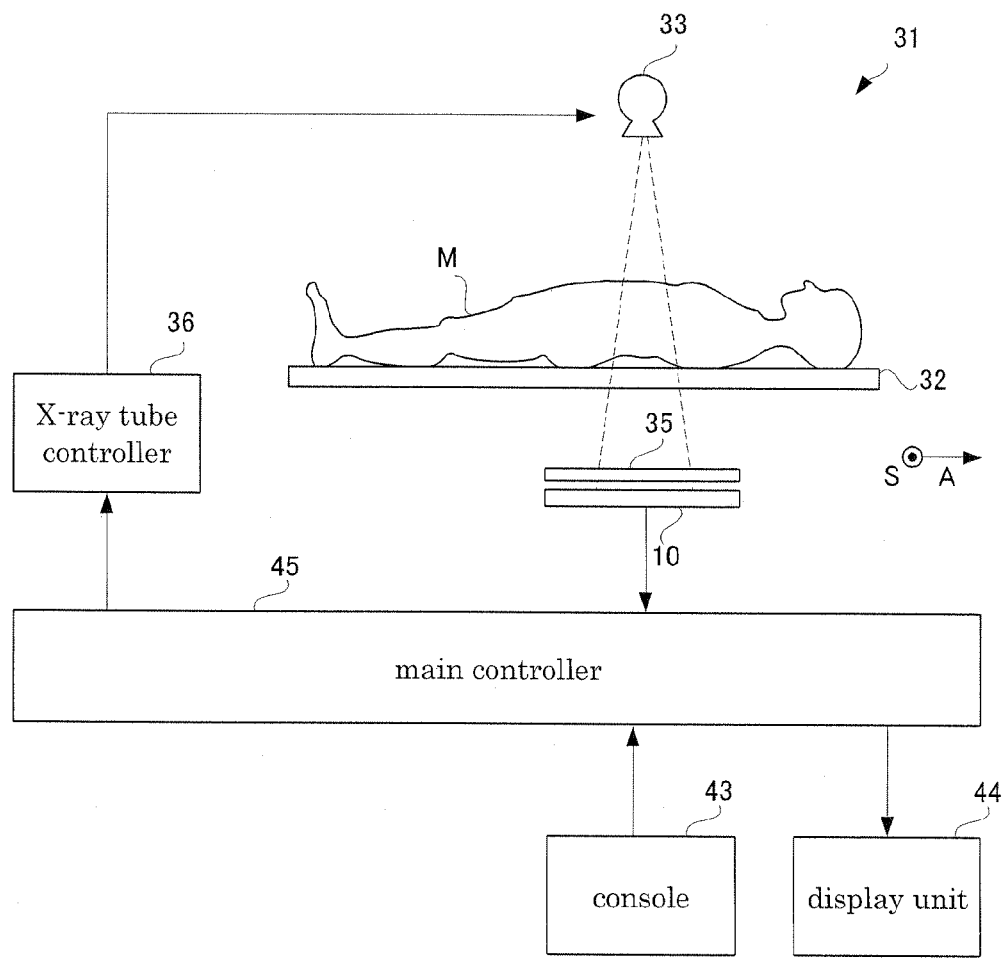
FIG. 4 is a sectional view illustrating a construction of an X-ray apparatus according to Embodiment 2.
Figure 5:
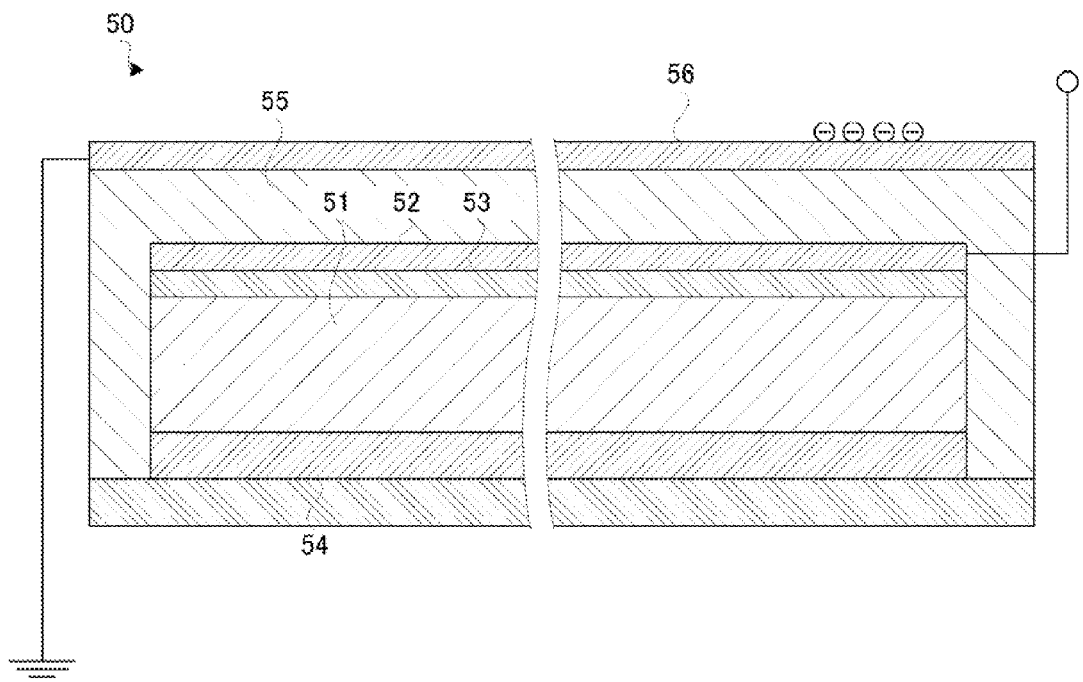
FIG. 5 is a sectional view illustrating a construction of an X-ray detector according to the prior art.
Figure 6:
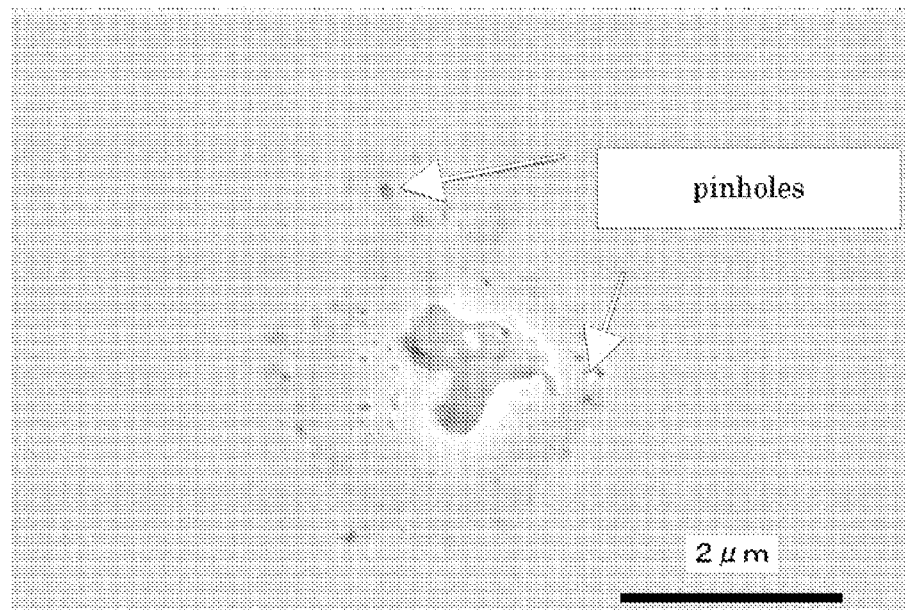
FIG. 6 is an electron micrographic view illustrating the construction of the X-ray detector according to the prior art.
Figure 7:
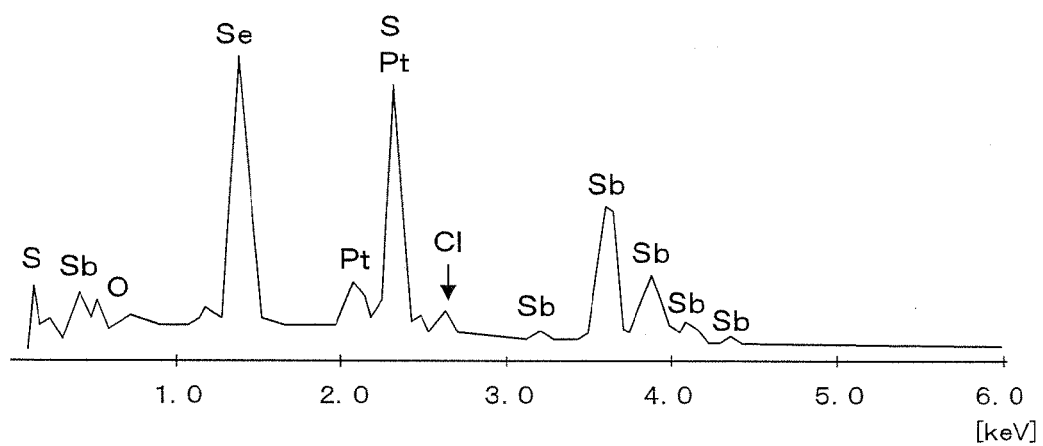
FIG. 7 is spectral data illustrating the construction of the X-ray detector according to the prior art.
Figure 8:
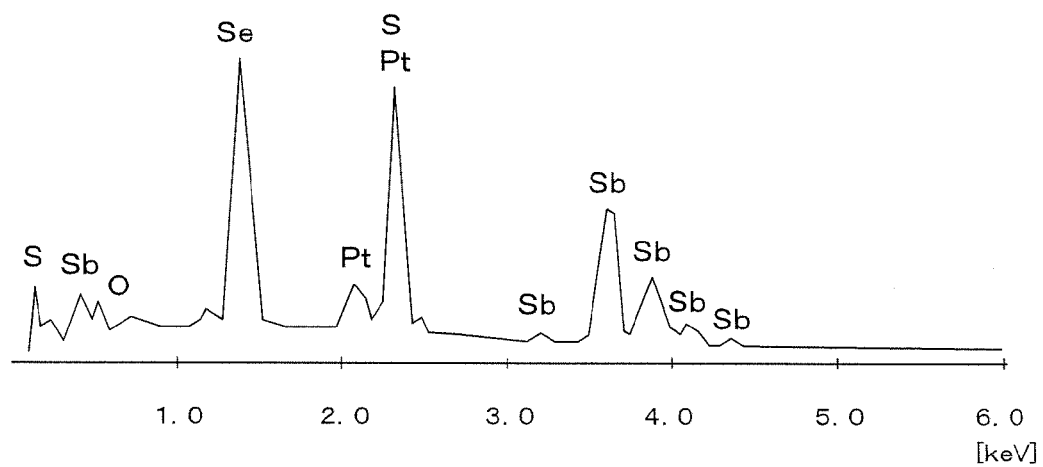
FIG. 8 is spectral data illustrating the construction of the X-ray detector according to the prior art.

First, the construction of an X-ray apparatus 31 according to Embodiment 2 will be described. FIG. 4 is the functional block diagram illustrating the construction of the X-ray apparatus 31 according to Embodiment 2. As shown in FIG. 4, the X-ray apparatus 31 according to Embodiment 2 includes a top board 32 for supporting a patient M, an X-ray tube 33 disposed above the top board 32 for emitting X-ray beams in pulse form, the X-ray, detector 10 for detecting X-rays transmitted through the patient M, and an X-ray grid 35 for removing scattered X-rays incident on the X-ray detector 10. The construction of Embodiment 2 includes also an X-ray tube controller 36 for controlling tube voltage and tube current of the X-ray tube 33, and temporal width of the pulse of the X-ray beams. The X-ray apparatus corresponds to the radiographic apparatus in this invention. The X-ray tube corresponds to the radiation source in this invention.

The X-ray apparatus 31 includes a console 43 for receiving instructions of the operator, and a display unit 44 for displaying X-ray fluoroscopic images or dynamic images.

The X-ray apparatus 31 further includes a main controller 45 for performing overall control of the X-ray tube controller 36. This main controller 45 is formed of a CPU, which executes various programs to realize the respective components. The respective components mentioned above may be realized as divided into arithmetic units in charge thereof.

The X-ray tube 33 emits X-rays toward the patient with a predetermined tube current, tube voltage and irradiation time under control of the X-ray tube controller 36.

Operation of the X-ray apparatus 31 having such construction will be described. First, the patient M is placed on the top board 2. The operator controls the X-ray tube 33 through the console 43 to emit X-rays toward the patient M. X-rays transmitted through the patient M are detected by the X-ray detector 10. Detection data (amplified data) is outputted to the image generating unit 15 (see FIG. 2), where an X-ray fluoroscopic image showing a fluoroscopic image of the patient M is generated. This X-ray fluoroscopic image is displayed on the display unit 44, which completes acquisition of the X-ray fluoroscopic image by the X-ray apparatus 31 according to Embodiment 2.

According to the construction of Embodiment 2, the X-ray apparatus 31 is provided which includes the X-ray detector 10 having little possibility of breakdown.

This invention is not limited to the foregoing embodiments, but may be modified as follows.

(1) In each foregoing embodiment, the auxiliary plate 6 is grounded. This may be made a positive potential lower in potential than the gold electrode layer 2.

(2) In each foregoing embodiment, amorphous selenium is used as the conversion layer, but this invention is not limited thereto. That is, a CdTe layer or CdZnTe layer can also be used in place of amorphous selenium.

(3) Each foregoing embodiment is directed to an apparatus for medical use, but this invention is applicable also to apparatus for industrial and nuclear Uses.

(4) The X-rays in each foregoing embodiment are an example of radiation in this invention. Therefore, this invention can be adapted also to radiation other than X-rays.

[Industrial Utility]

As described above, this invention is suitable for radiographic apparatus for medical use.

The invention claimed is:

1. A radiation detector comprising:
a conversion layer for converting light or radiation into carriers;
a common electrode layer to which a positive bias voltage is applied;
an insulating layer; and
a grounded conductive layer;

which are laminated in this order on an active matrix substrate having a plurality of switching elements for reading the carriers;
wherein the insulating layer includes an anion exchanger.

2. The radiation detector according to claim 1, comprising resistance film disposed between the conversion layer and the common electrode layer for selectively transmitting the carriers.

3. The radiation detector according to claim 1, wherein the insulating layer is formed of an epoxy resin.

4. The radiation detector according to claim 1, wherein:
the conversion layer comprises amorphous selenium; and
the common electrode layer is a gold electrode layer whose thickness in a direction of lamination is at most 200 nm.

5. The radiation detector according to claim 1, wherein the anion exchanger is an inorganic anion exchanger.

6. The radiation detector according to claim 5, wherein the anion exchanger adsorbs chloride ions.

7. The radiation detector according to claim 5, wherein the anion exchanger is at least one substance selected from a group consisting of a hydrotalcite compound, zirconium hydroxide, titanium hydroxide, yttrium compound, bismuth hydroxide, bismuth nitrate and bismuth oxide compound.

8. The radiation detector according to claim 5, wherein the anion exchanger is exclusive of chlorine atoms.

9. The radiation detector according to claim 1, comprising side insulating layers formed of the same material as the insulating layer, and covering side surfaces of the conversion layer, the common electrode layer and the insulating layer laminated.

10. A radiographic apparatus having the radiation detector according to claim 1, the apparatus comprising a radiation source for emitting radiation.

11. The radiation detector according to claim 2, wherein:
the conversion layer comprises amorphous selenium; and
the common electrode layer is a gold electrode layer whose thickness in a direction of lamination is at most 200 nm.

12. The radiation detector according to claim 3, wherein:
the conversion layer comprises amorphous selenium; and
the common electrode layer is a gold electrode layer whose thickness in a direction of lamination is at most 200 nm.

13. The radiation detector according to claim 2, wherein the anion exchanger is an inorganic anion exchanger.

14. The radiation detector according to claim 3, wherein the anion exchanger is an inorganic anion exchanger.

15. The radiation detector according to claim 4, wherein the anion exchanger is an inorganic anion exchanger.

* * * * *